United States Patent
Bijl et al.

(10) Patent No.: US 8,944,047 B2
(45) Date of Patent: Feb. 3, 2015

(54) DEVICE FOR CONVERTING SOLAR ENERGY

(75) Inventors: Roy Bijl, Riethoven (NL); Peter Penning, Waaire (NL)

(73) Assignee: Suncycle International GmbH, Zug (CH)

( * ) Notice: Subject to any disclaimer, the term of this patent is extended or adjusted under 35 U.S.C. 154(b) by 1506 days.

(21) Appl. No.: 12/296,391

(22) PCT Filed: Apr. 5, 2007

(86) PCT No.: PCT/NL2007/000095
§ 371 (c)(1),
(2), (4) Date: Jan. 6, 2009

(87) PCT Pub. No.: WO2007/117136
PCT Pub. Date: Oct. 18, 2007

(65) Prior Publication Data
US 2009/0159077 A1  Jun. 25, 2009

(30) Foreign Application Priority Data

Apr. 7, 2006 (NL) ..................... 1031544

(51) Int. Cl.
*F24J 2/08* (2006.01)
*H01L 31/052* (2014.01)
(Continued)

(52) U.S. Cl.
CPC ............ *H01L 31/0522* (2013.01); *F24J 2/06* (2013.01); *F24J 2/085* (2013.01); *F24J 2/10* (2013.01);
(Continued)

(58) Field of Classification Search
USPC ......... 126/573, 572, 574–577, 683, 698, 699, 126/657, 684, 688–691

IPC .............. F24J 2/00,2/38, 2/40, 2/54, 2/06, 2/08, F24J 2/10
See application file for complete search history.

(56) References Cited

U.S. PATENT DOCUMENTS 3,923,039 A * 12/1975 Falbel ........................... 126/600
4,836,672 A *  6/1989 Naiman et al. ............... 356/5.06
(Continued)

FOREIGN PATENT DOCUMENTS

DE   4126623    2/1993
EP   0338555   10/1989
(Continued)

OTHER PUBLICATIONS

International Search Report, International Application No. PCT/NL2007/000095, Jul. 17, 2007, 3 pp.
(Continued)

*Primary Examiner* — Stephen M Hepperle
*Assistant Examiner* — Umashankar Venkatesan
(74) *Attorney, Agent, or Firm* — Haynes and Boone LLP

(57) ABSTRACT

The invention relates to a device (10) for converting solar energy, comprising a solar radiation capturing unit (11) comprising at least one lens having a entry surface (11a) for the incident solar radiation and an exit surface (11b) for emitting the solar radiation in refracted form to a solar radiation concentrating unit (12) comprising a reflector surface (12a) for reflecting the solar radiation incident on the reflector surface (12a) from the exit surface of the lens (11b) to at least one target area (13) of the solar radiation concentrating unit (12). The device (10) comprises positioning means (14) for orienting the solar radiation capturing unit (11) and the solar radiation concentrating unit (12) with respect to each other through rotation about at least one axis (11') perpendicular to a plane formed by the lens.

30 Claims, 7 Drawing Sheets

(51) Int. Cl.
*F24J 2/06* (2006.01)
*F24J 2/10* (2006.01)
*F24J 2/38* (2014.01)
*F24J 2/54* (2006.01)

(52) U.S. Cl.
CPC .... *F24J 2/38* (2013.01); *F24J 2/54* (2013.01); *F24J 2002/1019* (2013.01); *Y02E 10/43* (2013.01); *Y02E 10/44* (2013.01); *Y02E 10/47* (2013.01); *Y02E 10/52* (2013.01)
USPC .......................................... 126/683; 126/699

(56) References Cited

U.S. PATENT DOCUMENTS

| | | | | |
|---|---|---|---|---|
| 5,374,939 | A * | 12/1994 | Pullen V | 343/839 |
| 5,934,271 | A * | 8/1999 | Kaneff | 126/600 |
| 6,881,893 | B1 * | 4/2005 | Cobert | 136/246 |
| 6,958,868 | B1 | 10/2005 | Pender | 359/742 |
| 2005/0091979 | A1 * | 5/2005 | Bareis | 60/641.14 |
| 2009/0000612 | A1 * | 1/2009 | Hines et al. | 126/683 |
| 2009/0078302 | A1 * | 3/2009 | Navanteri | 136/246 |
| 2010/0006088 | A1 * | 1/2010 | Campbell et al. | 126/573 |
| 2010/0175685 | A1 * | 7/2010 | Campbell et al. | 126/601 |
| 2011/0114079 | A1 * | 5/2011 | Heckendorn | 126/574 |

FOREIGN PATENT DOCUMENTS

| | | | | |
|---|---|---|---|---|
| JP | 61-180217 | | 8/1986 | |
| JP | S 63-254772 | A | 10/1988 | |
| JP | H 04-333810 | A | 11/1992 | |
| JP | H 07-326214 | A | 12/1995 | |
| JP | 08304692 | A * | 11/1996 | G02B 7/182 |
| JP | 2002-81760 | | 3/2002 | |
| JP | 2003-322419 | A | 11/2003 | |
| WO | WO 01/59361 | | 8/2001 | |

OTHER PUBLICATIONS

Korean Office Action and English Translation for Application No. 10-2008-7026324 mailed Nov. 28, 2013, 7 pages.

* cited by examiner

DEVICE FOR CONVERTING SOLAR ENERGY

The invention relates to a device for converting solar energy, comprising a solar radiation capturing unit comprising at least one lens having a entry surface for the incident solar radiation and an exit surface for emitting the solar radiation in refracted form to a solar radiation concentrating unit comprising a reflector surface for reflecting the solar radiation incident on the reflector surface from the exit surface of the lens to at least one target area of the solar radiation concentrating unit.

Such a device is for example disclosed in U.S. Pat. No. 4,230,094. Said document discloses a solar radiation capturing unit combined with a solar radiation concentrating unit having a reflector surface. The solar radiation incident on the lens of the solar radiation capturing unit is refracted at varying angles and reflected by the reflector surface to a target area, where the solar radiation is captured and converted into another form of energy.

In the embodiment according to U.S. Pat. No. 4,230,094 the target area is configured as an elongated, hollow pipe, through which water is passed. The water is to be heated by the solar radiation incident on the target area, which is concentrated by the reflector surface. Thus, the solar energy is converted into thermal energy, and more in particular into a temperature increase of the water flowing through the pipe.

The construction disclosed in U.S. Pat. No. 4,230,094 is characterised by considerable constructional dimensions, which make the construction expensive and unwieldy but, in addition, also less functional in use. In addition to that, said known solar energy converting device is characterised by a generally varying efficiency, because the conversion of solar energy into another form of energy is to a large degree dependent on the position of the sun.

The object of the invention is precisely to realise a device according to the introduction, by which an efficient conversion of solar energy can be realised at different positions of the sun and which moreover has compact constructional dimensions.

According to the invention, the device is to that end characterised in that the device comprises positioning means for orienting the solar radiation capturing unit and the solar radiation concentrating unit with respect to each other through rotation about at least one axis perpendicular to a plane formed by the lens. Since the solar radiation capturing unit and the solar radiation concentrating unit can be oriented with respect to each other in dependence on the position of the sun, solar radiation reflected by the reflector surface is continuously concentrated in one point on the reflector surface.

In comparison with stationary devices, such as the device that is known from U.S. Pat. No. 4,230,094, the device according to the invention provides a more effective concentration and conversion of solar radiation into another form of energy. In comparison with moving devices as disclosed in EP-A-1 174 658, the device has a constant shape and is less complex, which means a saving in costs and constructional outlay. The device is thus more universally applicable, for example in buildings.

In a first embodiment, the axes of rotation of the solar radiation capturing unit and the solar radiation concentrating unit are two different axes, whilst in another, more easily controlled and more compact device the axes of rotation of the solar radiation capturing unit and the solar radiation concentrating unit coincide.

A specific embodiment is characterised in that the solar radiation capturing unit and the solar radiation concentrating unit can be oriented in separate planes with respect to each other by positioning means.

As a result of the independent positioning of the solar radiation capturing unit and the solar radiation concentrating unit in separate planes or, put differently, in two parallel, spaced-apart planes, an optimum concentration of the solar radiation refracted by the lens and being incident on the reflector surface is effected in one specific target area, irrespective of the position of the sun in the sky during the day when the device is operated.

In this way a considerable efficiency improvement is realised, because—apart from the usual efficiency losses of the various components—the solar radiation is constantly concentrated in the same point as a result of the orientation in two parallel planes of the lens and the reflector surface with respect to each other. Consequently, one solar energy conversion component will suffice in said one point, which not only leads to a simpler but also to a cheaper construction of the device.

A very functional embodiment of the device according to the invention is characterised in that the positioning means are arranged for orienting the solar radiation capturing unit and the solar radiation concentrating unit with respect to each other on the basis of the current position of the sun in the sky, the optical characteristics of the device as well as the orientation of the device. In this way a fully autonomous device is realised, which moreover controls the exact orientation or rotation of the solar radiation capturing unit and the solar radiation concentrating unit with respect to each other in a very precise manner.

More specifically, this embodiment is further characterised in that the positioning means comprise an arithmetic unit, which is arranged for determining the current position of the sun in the sky on the basis of the geographic position and orientation on earth as well as the day and the time of day. In this way the exact position of the sun in the sky can be continually determined in a precise, autonomous manner so as to obtain an optimum capturing of the solar radiation and concentrated reflection of the solar radiation to the target area.

In a functional embodiment of the invention, the device comprises a frame in which the solar radiation capturing unit and the solar radiation concentrating unit are rotatably mounted.

A reliable and robust orientation of the solar radiation capturing unit and the solar radiation concentrating unit is realised in that a guide functioning as a chute is mounted in the frame, over which guide the solar radiation capturing unit and the solar radiation concentrating unit can be moved by the positioning means. In another embodiment, several rollers supporting the solar radiation capturing unit and the solar radiation concentrating unit may be mounted in the frame.

At least one of said rollers can be driven by the positioning means, for example by motors that can be controlled by the positioning means. In another embodiment, the solar radiation capturing unit and the solar radiation concentrating unit may be movable over the guide or over the rollers in the frame by means of a belt transmission that can be controlled by the positioning means.

In specific embodiments of the lens, the lens is characterised in that the entry surface of the lens is a flat surface.

To realise an adequate refraction of incident light on the lens in the direction of the reflector surface of the solar radiation concentrating unit, the lens surface on the side facing away from the solar radiation is configured as a stepped lens. More specifically, the exit surface of the lens is configured as a stepped, straight prism lens. In combination with the rotation of the lens about an axis, a fixed exit angle of the solar radiation from the exit surface configured as a stepped lens, more in particular a stepped, straight prism lens, is realised in this manner, irrespective of the position of the sun in the sky, and consequently irrespective of the angle of incidence of the solar radiation on the entry surface of the length.

More specifically, the prism lens angle ranges between 15° and 50°, in particular it is 36°.

More in particular, in one embodiment the solar radiation capturing unit is arranged for emitting solar radiation to the solar radiation concentrating unit at a fixed exit angle ranging between 15° and 55°, in particular at an exit angle of 36°.

To realise an optimum capturing of the solar radiation also in moderate climate regions, the device can be positioned at an angle with respect to the horizontal, in particular an angle of 45° for the Netherlands.

Although it is preferable to maintain a fixed angle of the device with respect to the horizontal, a more versatile device is characterised in that said angle is adjustable in dependence on the degree of latitude of the place where the device is located. For the Netherlands this angle is 45°, but for the equator it is 0°.

In a functional embodiment, the reflector surface comprises at least one concave curvature. Thus an optimum reflection of the solar radiation exiting from the exit surface of the lens to a concentration point is realised. This leads to a considerable efficiency improvement of the device, because in this way a larger amount of incident solar radiation can be concentrated in an effective manner towards the solar energy conversion component that can be disposed in the target area.

However, the use of a hollow curvature may result in a partial loss of solar radiation exiting the lens between the lens and the mirror at the location of the target area defined by the curvature. To achieve an effective reflection and concentration by the reflector surface also of this portion of the solar radiation refracted by the lens, the reflector surface of another, more functional embodiment is configured so that the first hollow curvature of the reflector surface blends into a second hollow curvature different from said first curvature at a point near the associated target area, which second curvature likewise forms a target area for solar radiation. Thus, the light exiting the lens is effectively reflected and concentrated in both target areas over the entire reflector area of the solar radiation concentrating unit.

As a result of the functional aspects of the device according to the invention, wherein a maximum amount solar radiation exiting the lens is reflected by the reflector surface and concentrated in the target areas in an effective manner, only two solar radiation concentrator cells disposed in the target area will suffice, or only one cell, in which case also the incident solar radiation in the second target area is reflected to this cell (together with the incident solar radiation in the first target area).

More specifically, the solar radiation concentrator sell is disposed at the edge of the reflector and thus moves along with the reflector as a result of being oriented by the positioning means. The invention will now be explained in more detail with reference to a drawing, in which.

For a better understanding of the invention, like parts will be indicated by the same numerals in the description of the figures below.

Figure 1A:
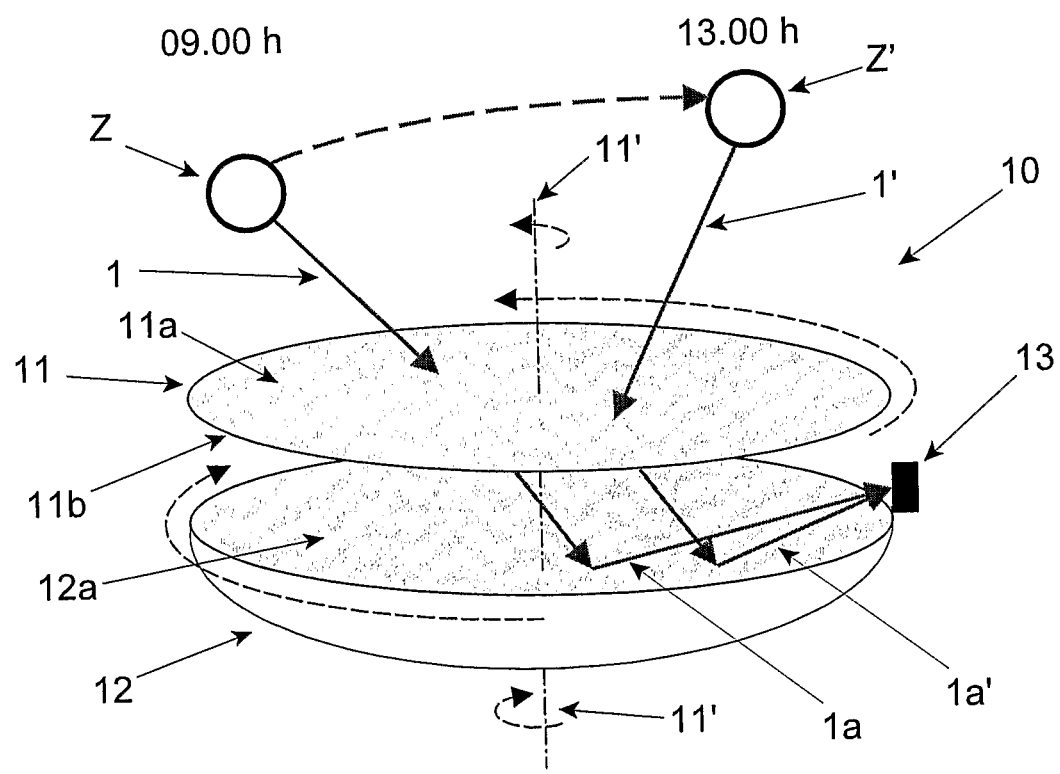
FIGS. 1a and 1b show two embodiments of the device according to the invention.
Figure 1B:
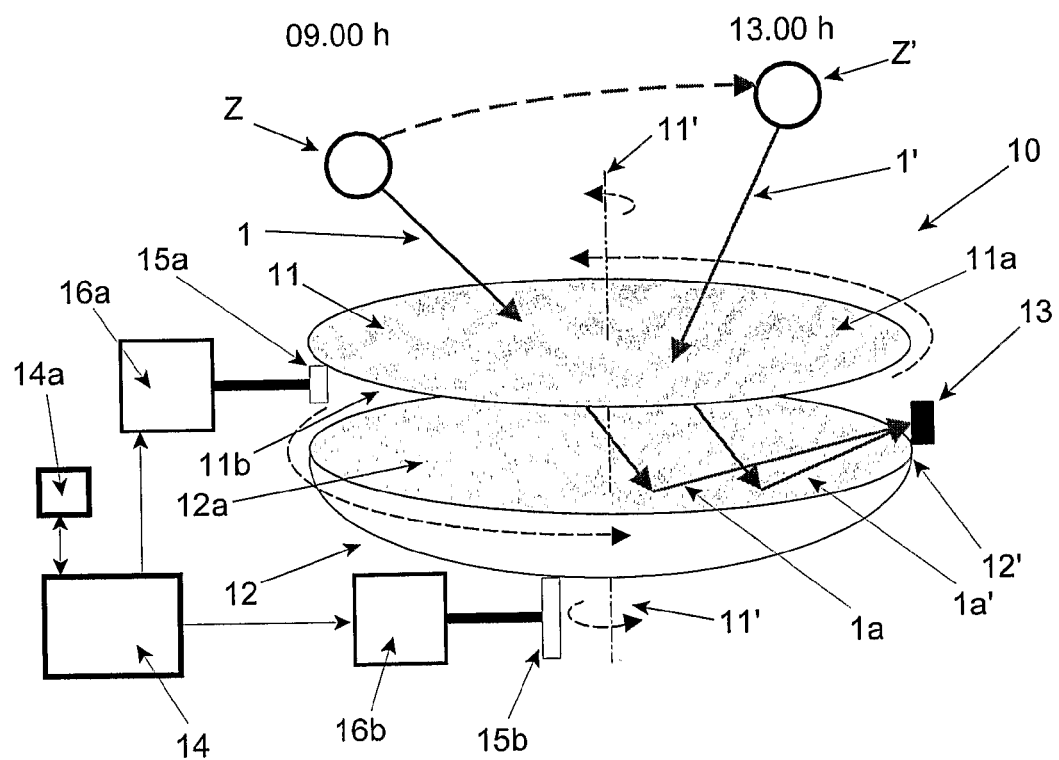

FIGS. 1a and 1b show two embodiments of a device according to the invention for converting solar energy. The device 10 is made up of a solar radiation capturing device 11, schematically represented as a lens having an entry surface 11a and an exit surface 11b. The lens a functions to capture solar radiation 1 emitted by the sun Z. The solar radiation 1 will be refracted by the lens in accordance with Snellius' refraction laws, as will be discussed hereinafter, and be reflected in the direction of a solar radiation concentrating unit 12 at an angle different from the angle at which the solar radiation 1 is incident on the entry surface 11a.

The solar radiation concentrating unit 12 comprises a reflector 12 provided with a reflection surface 12a, for example consisting of an aluminium or chromium coating.

The lens 11 comprises a lens surface, whilst the circumferential edge of the reflector 12 also forms a surface, the lens 11 and the reflector 12 being positioned in such a manner with respect to each other that the two surfaces formed by the lens 11 and the reflector 12 extend in spaced-apart yet parallel relationship. The axis 11' of the lens 11 intersects the two imaginary surfaces perpendicularly. This arrangement shown in FIGS. 1a and 1b is essential for the understanding and above all for the functioning of the device according to the invention.

As will be explained hereinafter, the angle of incidence of the incident solar radiation 1 on the entry surface 11a will depend on the position of the sun Z in the sky. This is schematically shown in FIGS. 1a and 1b, in which the sun (indicated by the letter Z) takes up a position in the sky corresponding to 9.00 am, whilst the sun indicated by the letter Z' takes up a position corresponding to 13.00 pm. Because of the different angles of incidence on the entry surface 11a of the solar radiation 1 and 1', respectively (depending on the position of the sun in the sky), the light refracted by the lens 11 will exit the exit surface 11b in the direction of the reflector surface 12a of the reflector 12 at different exit angles.

To concentrate and capture said refracted solar radiation 1a, 1a' in an efficient manner in a target area 13, the reflector surface 12a of the reflector 12 exhibits a parabolic curvature. Moreover, by orienting the lens 11 and the reflector 12 with respect to each other in accordance with the invention through rotation about the axis 11' effected by positioning means (not shown), the refracted solar radiation 1a, 1a' exiting the lens 11 is reflected by the reflector surface 12a to a target area 13 located at the circumferential edge 12' of the reflector 12 (see FIG. 1b).

Although the target area 13 is schematically indicated in FIGS. 1a and 1b, a solar radiation concentrator cell, for example a photovoltaic cell, must be disposed in the target area 13. In this way all the incident solar radiation on said cell can be converted into another form of energy, for example electric energy, in an effective manner, not taking into account any efficiency losses. Said energy may be carried away from the target area 13, in a manner that is not relevant to the present invention, for further utilisation thereof.

As FIG. 1a shows, both the lens and the reflector 12 are rotatably driven about the axis 11' of the lens 11, and that in such a manner that the lens 11 can carry out a rotary movement that is independent of the rotary movement of the reflector 12.

Figure 2:
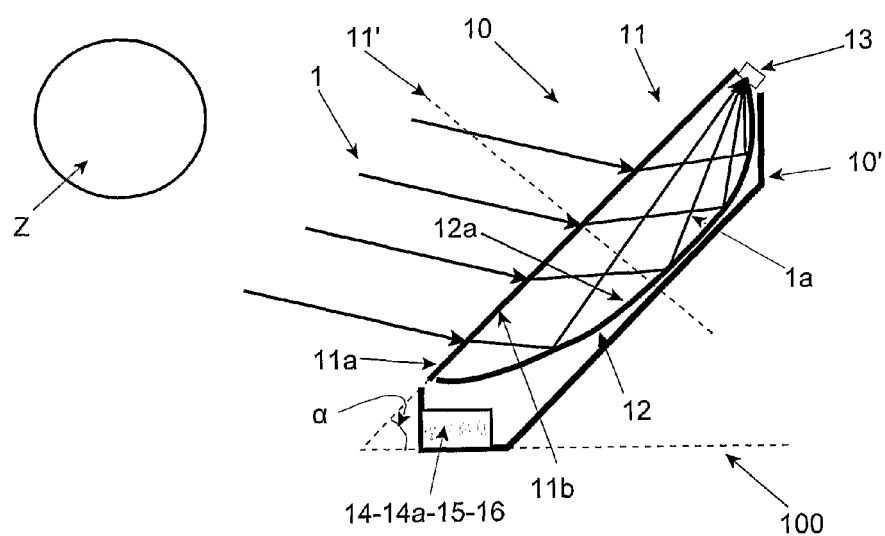
FIG. 2 shows another view of a device according to the invention.

FIG. 1b shows another embodiment of the device, in which the lens 11 and the reflector 12 are both relegated in the same direction about the axis 11'. Both the lens 11 and the reflector 12 are to that end mounted in a frame 10' (see FIG. 2) and are supported by several rollers or wheels or bearings 15a, 15b, respectively, only one roller 15a, 15b, respectively, of which is shown for easy reference in FIG. 1b. The rollers 15a-15b can be driven by suitable motors, for example stepper motors 16a-16b, which are suitably controlled by the positioning means 14.

On the other hand, the lens 11 and the reflector 12 may be suitably rotated in the device by means of a belt drive or by being placed on a chute.

The positioning means 14 are arranged to control the motors 16a-16 independently of each other, so that the lens and the reflector 12 can be oriented at different rotational speeds about the axis 11' with respect to each other.

The rotation of the lens 11 and the reflector 12 is determined on the basis of the current position of the sun Z (Z', respectively) in the sky, the optical characteristics of the lens 11 as well as the overall orientation of the device 10 with respect to the horizontal. To be able to determine the current position of the sun Z (Z', respectively), the positioning means 14 comprise an arithmetic unit 14a, which determines the current position of the sun Z in the sky on the basis of the geographic position and orientation of the device 10 on earth, as well as the day and the time of that day.

The arithmetic unit 14a to that end comprises suitable storage means and data processing means, such as an mathematic processor, as well as a computer programme that determines the current position of the sun in the sky on the basis of the aforesaid criteria. On the basis of that, the stepper motors 16a-16b are controlled via the positioning means for orienting the lens 11 and the reflector 12 with respect to each other and with respect to the sun Z (Z').

Although the lens 11 and the reflector 12 are illustrated in such a manner in FIGS. 1a and 1b that the imaginary surfaces formed by the two parts extend parallel to the horizontal, it will be understood that in order to achieve a significant efficiency improvement it must be possible to position the device 10 at an angle α with respect to the horizontal 100. Said angle α may moreover be variably adjustable by suitable means. Thus, the device 10 can be directed at the sun also in moderate climates region, in particular in the winter, when the intensity of the solar radiation is low, through suitable angular orientation thereof. See FIG. 2.

Also in this manner the amount of solar radiation, which is small during said period of the year, can be captured in an efficient manner and be concentrated in the target area 13 after refraction and reflection by the lens 11 and the reflector 12, respectively, and the concentrated solar energy can be converted into another form of energy by means of a suitable solar cell. The angle of rotation through which the lens 11 and the reflector 12 are to be rotated about the axis 11' strongly depends on the geographic position on earth, the angular setting or orientation of the device with respect to a horizontal, but above all on the position of the sun and the physical properties of the lens.

Figure 4:
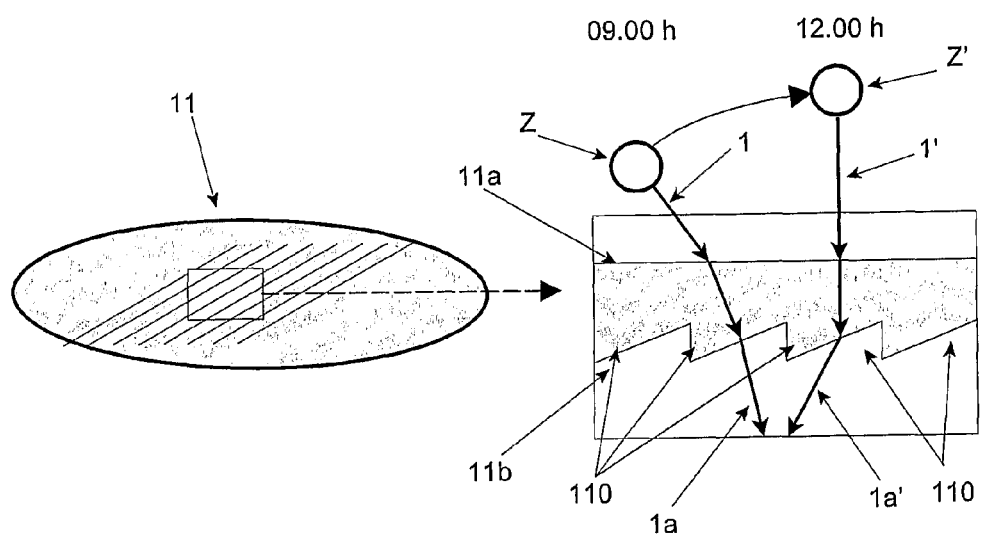
FIG. 4 shows a partial view of a device according to the invention.
Figure 5:
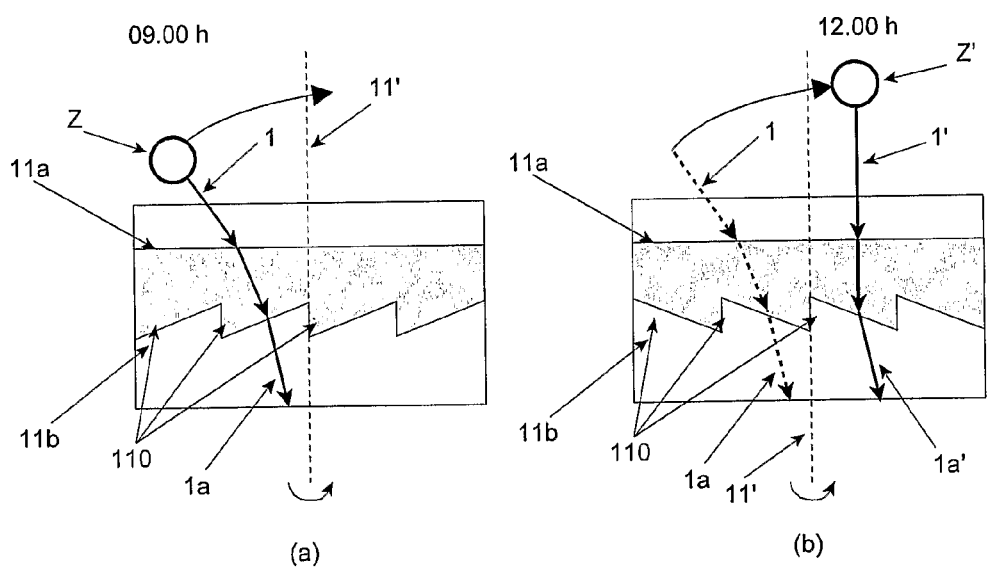
FIGS. 5a and 5b show two operating conditions of the device according to the invention.

The device according to the invention makes it possible to realise a significant efficiency improvement in that the lens 11 has a flat entry surface 11a and in that the exit surface 11b of the lens 11 is configured as a stepped prism lens. This is shown in FIG. 4, in which the exit surface is provided with straight grooves 110' extending parallel to each other, thereby realising an exit surface 11b having a serrated shape. More specifically, the exit surface 11b is configured as a stepped, straight prism lens, as shown in FIGS. 4, 5a and 5b.

The efficiency improvement of the device according to the invention is in particular effected in that the lens 11 is rotated about its axis 11' by the positioning means 14. Thus, the light will exit the exit surface 11b at the same angle at all times, irrespective of the position of the sun Z (Z') in the sky.

FIG. 4 shows the situation in the case of a stationary lens 11. Reference letter Z indicates the position of the sun in the sky at 9.00 am. After a first refraction at the entry surface 11a and a second refraction at the exit surface 11b, the incident solar radiation 1 will exit the lens 1 in the form of refracted solar radiation. When the sun is at its zenith in the sky at 12.00 am (noon) (indicated at Z'), the solar radiation 1' that enters the entry surface at an angle of incidence of 90° will exit the exit surface 11b at an angle (represented as the sunray 1a') different from the exit angle of the solar radiation 1a at 9.00 am.

In the case of a stationary lens 11, the incident solar radiation will be refracted at varying angles, therefore, depending on the position of the sun, and thus also be reflected at varying angles by the reflector surface 12b disposed under the lens 11. An adequate or efficient concentration of solar radiation 1a-1a' in one target area 13 will not be possible with a stationary lens 11. By rotating the lens about its axis 11', a constant exit angle for the exiting light 1a-1a' can be realised by constantly varying the orientation of the stepped prism lens surface 11b, as is shown in FIG. 5b.

Experiments have shown that a fixed exit angle for the solar radiation 1a-1a' can be realised for solar radiation incident on the flat entry surface 11a of the lens 11 at an angle of 20-90°. If the entire device 10 is directed at the south at an angle α of 45°, solar radiation can be captured in an effective manner from 7.30-8.00 am to 16.00-16.30 pm in for example the Netherlands, and be concentrated in the target area 13 after refraction and reflection.

To effect a fixed exit angle of the exiting solar radiation 1a-1a', the rotation of the lens 11 must be calculated by the arithmetic unit 14a. As already mentioned above, in addition to the current position of the sun in the sky also the optical characteristics of the lens 11 and the orientation of the device 10 with respect to the horizontal play a part.

The lens 11 may be made of glass, perspex (PMMA), polycarbonate or another suitably transparent and durable material. Perspex and polycarbonate are plastics which are easy to process in a mould. The preferred embodiment of the lens 11 has a flat entry surface 11a and is provided with a toothing, preferably a straight toothing (serration), so that the exit surface 11b is configured as a stepped, straight prism lens.

The efficiency of the lens 11 is adversely affected in particular by the reflection on the flat entry surface 11a, the transmission losses of the solar radiation through the lens 11 to the exit surface 11b, possible reflection of solar radiation on the exit surface 11b and the loss of solar radiation caused by the toothed profile of the exit surface 11b configured as a stepped prism lens.

Experiments have shown that for moderate climate regions, such as the Netherlands, solar radiation 1 is directed at the reflector 12 with a maximum degree of efficiency by using a lens 11 having a prism lens angle of 36° and a fixed exit angle of 36° in the direction of the lens surface 12b, with the entire device being oriented towards the south at an angle of 45°.

Figure 3:
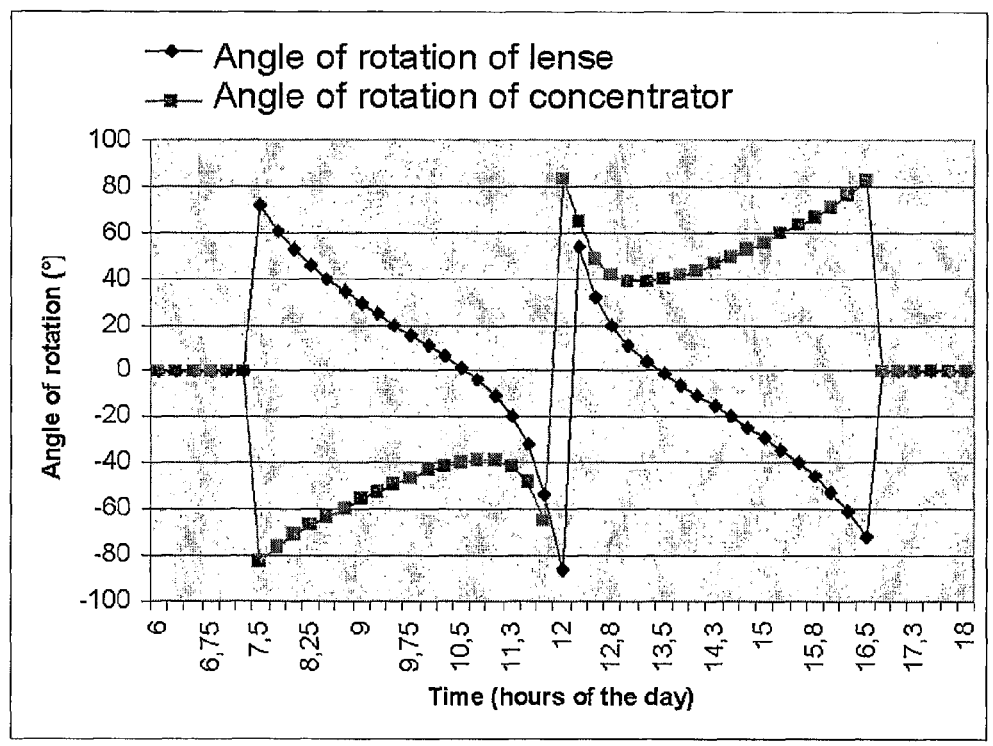
FIG. 3 shows a table relating to the rotational drive of the devices according to the invention.

The diagram of FIG. 3 shows the angles of rotation of the lens 11 (and the reflector 12) at the various positions of the sun in the sky on 21 June (in the Netherlands) for this lens configuration. In said diagram, the hours of the day (in this case 21 June) are plotted on the horizontal axis, and the specific angles of rotation of the lens 11 and the reflector 12 for each point in time are plotted on the vertical axis. Said angles of rotation are determined on the basis of the arithmetic model (or computing programme) that is carried out by the arithmetic unit 14a on the basis of the various positions of the sun Z in the sky on 21 June.

It has been found that with a 45° orientation to the south (in the Netherlands) and angles of incidence of the solar radiation between 20° and 90°, a lens having a maximum average efficiency (over the entire day) is obtained, if the lens is provided with a stepped prism lens surface 11b exhibiting a lens angle of 36° and a fixed exit angle between 15° and 55°, in particular 36°, that occurs with these different positions of the sun in the sky. With this lens a degree of efficiency of 77% is achieved in this manner.

To achieve an efficient concentration of solar radiation 1a-1a' on the reflector surface 12b and a concentrated reflection of the solar radiation 1a-1a' to the target area 13, the reflector surface 12b of the reflector 12 exhibits at least one concave curvature, for example a parabolic or hyperbolic curvature. Thus, reflection to the focus of the concave curvature takes place. In this case, too, the reflector 12 may be made of a plastic identical that of the lens 11, with the reflector 12 being coated with a reflective material, such as an aluminium or chromium coating.

The reflector 12 may also be made of a metal, however, in which case the reflector surface 12a needs to be polished. Also in this case an efficiency loss must be taken into account in the reflection of the exiting solar radiation 1a-1a' on the reflector surface. However, there are coatings and other reflective materials available which reflect over 95% of the incident solar radiation.

Figure 6:
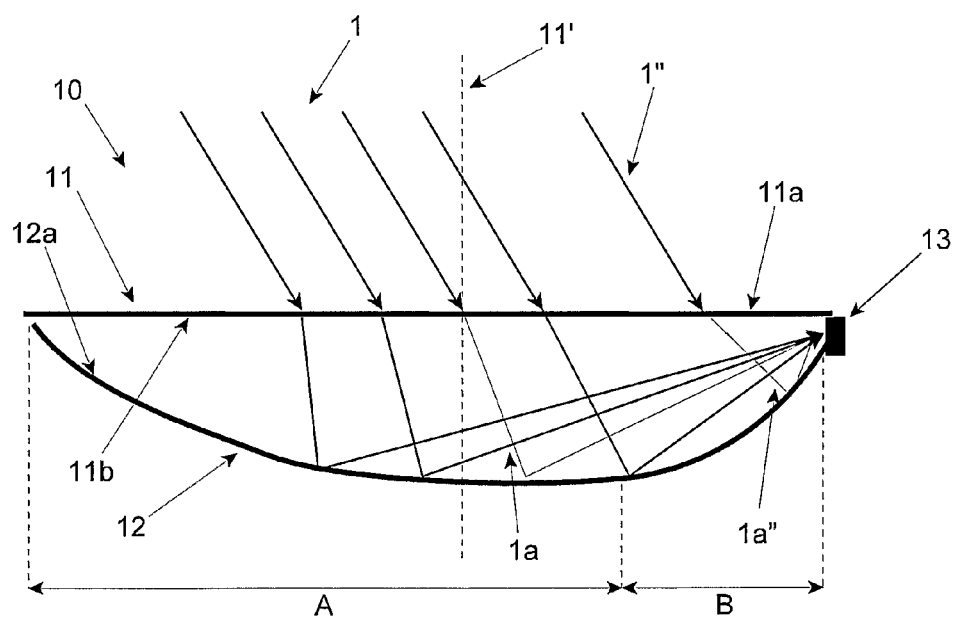
FIG. 6 shows a partial view of a device according to the invention.

If the reflector 12 is so constructed that the reflector surface 12a is only made up of one concave curvature, part of the incident light of the lens 11 will be lost after reflection by the reflector surface 12a. In particular the area at the location of the target area 13 (the solar cell 13) will reflect insufficient solar radiation in the direction of the target area. To reflect the incident light in this area of the reflector 12 near the target area 13 effectively as well, the first concave curvature (indicated A in FIG. 6) merges into a second concave curvature (indicated B), which second concave curvature is clearly different in shape from the first concave curvature.

By configuring the reflector surface 12a as two concave curvatures merging into one another, a further efficiency improvement of the overall system is realised, because also the incident solar radiation 1" near the target area 13 can be captured yet after refraction and reflection (as solar radiation 1a") by the solar cell (photovoltaic cell) disposed in the target area 13 or by a solar cell (photovoltaic cell) disposed in another target area.

In this way a very functional device for converting solar radiation is realized, wherein an optimum projection of solar radiation on the reflector surface 12a is effected by rotating the lens 11 and the specifically shaped reflector 12 relative to each other about the axis 11' of the lens 11, which solar radiation is concentrated by the reflector and directed to a target area.

The invention claimed is:

1. A device for converting solar energy, comprising
    a solar radiation capturing unit comprising at least one lens having an entry surface for the incident solar radiation and an exit surface for emitting the solar radiation in refracted form to
    a solar radiation concentrating unit comprising a reflector surface for reflecting the solar radiation incident on the reflector surface from the exit surface of the lens to at least one target area of the solar radiation concentrating unit,
    positioning means for orienting the lens and the reflector surface with respect to each other depending on a current position of the sun in the sky through rotation about at least one axis;
    wherein the target area is located at one side of said axis, and the reflector surface extends both to said side and the opposite side of said axis.

2. A device according to claim 1, wherein the solar radiation capturing unit and the solar radiation concentrating unit are rotatable to carry out rotary movements independent of each other.

3. A device according to claim 2, wherein the axes of rotation of the solar radiation capturing unit and the solar radiation concentrating unit coincide.

4. A device according to claim 1, wherein the solar radiation capturing unit and the solar radiation concentrating unit can be oriented in separate planes with respect to each other by positioning means.

5. A device according to claim 1, wherein the positioning means are arranged for orienting the solar radiation capturing unit and the solar radiation concentrating unit with respect to each other on the basis of the current position of the sun in the sky, the optical characteristics of the device as well as the orientation of the device.

6. A device according to claim 5, wherein the positioning means comprise an arithmetic unit, which is arranged for determining the current position of the sun in the sky on the basis of the geographic position and orientation on earth as well as the day and the time of day.

7. A device according to claim 1, wherein the device comprises a frame in which the solar radiation capturing unit and the solar radiation concentrating unit are rotatably mounted.

8. A device according to claim 7, wherein a guide functioning as a chute is mounted in the frame, over which guide the solar radiation capturing unit and the solar radiation concentrating unit can be moved by the positioning means.

9. A device according to claim 7, wherein several rollers supporting the solar radiation capturing unit and the solar radiation concentrating unit may be mounted in the frame.

10. A device according to claim 9, wherein at least one of said rollers can be driven by the positioning means.

11. A device according to claim 10, wherein said rollers can be driven by motors that can be controlled by the positioning means.

12. A device according to claim 7, wherein the solar radiation capturing unit and the solar radiation concentrating unit are movable in the frame by means of a belt transmission that can be controlled by the positioning means.

13. A device according to claim 1, wherein the entry surface of the lens is a flat surface.

14. A device according to claim 1, wherein the exit surface of the lens is configured as a stepped lens.

15. A device according to claim 14, wherein the exit surface of the lens is configured as a stepped, straight prism lens.

16. A device according to claim 15, wherein the prism lens angle ranges between 15° and 50°.

17. A device according to claim 14, wherein the solar radiation capturing unit is arranged for emitting solar radiation to the solar radiation concentrating unit at a fixed exit angle ranging between 15° and 55°.

18. A device according to claim 1, wherein the device can be positioned at an angle with respect to the horizontal.

19. A device according to claim 18, wherein said angle is adjustable in dependence on the degree of latitude of the place where the device is located.

20. A device according to claim 1, wherein the reflector surface comprises at least one concave curvature.

21. A device according to claim 1, wherein the first concave curvature of the reflector surface blends into a second concave curvature different from said first curvature at a point near its associated target area, which second concave curvature likewise forms an associated target area.

22. A device according to claim 1, wherein one solar radiation concentrator cell is present in the target area.

23. A device according to claim 22, wherein the solar radiation concentrator cell is disposed at the edge of the reflector.

24. A device according to claim 1, wherein the at least one axis of rotation is substantially perpendicular to a plane formed by the lens.

25. A device according to claim 16, wherein the prism lens angle is 36°.

26. A device according to claim 14, wherein the solar radiation capturing unit is arranged for emitting solar radiation to the solar radiation concentrating unit at a fixed exit angle of 36°.

27. A method for converting solar energy, the method comprising:
capturing solar radiation by a solar radiation capturing unit comprising at least one lens having an entry surface for the incident solar radiation and an exit surface for emitting the solar radiation in refracted form;
reflecting, by a reflector surface of a solar radiation concentrating unit, the solar radiation emitted from the exit surface, the reflector surface reflecting the solar radiation to at least one target area of the solar radiation concentrating unit;
automatically rotating the lens depending on the position of the sun to cause the lens to emit the solar radiation at a fixed angle to the exit surface;
wherein the target area is located at one side of said axis, and the reflector surface extends both to said side and the opposite side of said axis.

28. The method of claim 27 further comprising rotating the reflector surface depending on the position of the sun independently from the lens' rotary motion, to cause the solar radiation emitted from the exit surface to travel to the at least one target area.

29. The device of claim 1 wherein said orienting the lens and the reflector surface comprises rotating both the lens and the reflector surface by different angles for at least one change in the sun's position.

30. The method of claim 27 wherein said orienting the lens and the reflector surface comprises rotating both the lens and the reflector surface by different angles for at least one change in the sun's position.

* * * * *